(12) United States Patent
Asano et al.

(10) Patent No.: US 7,231,310 B2
(45) Date of Patent: Jun. 12, 2007

(54) METHOD FOR EVALUATING SEMICONDUCTOR DEVICE

(75) Inventors: Etsuko Asano, Kanagawa (JP); Kiyoshi Kato, Kanagawa (JP); Yutaka Shionoiri, Kanagawa (JP); Masahiko Hayakawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/132,434

(22) Filed: May 19, 2005

(65) Prior Publication Data

US 2005/0273290 A1 Dec. 8, 2005

(30) Foreign Application Priority Data

May 20, 2004 (JP) ............................. 2004-151093

(51) Int. Cl.
*G06F 19/00* (2006.01)

(52) U.S. Cl. ...................................... 702/117; 702/182

(58) Field of Classification Search .......... 702/81–108, 702/117, 118–120, 123–124, 126, 182, 189; 324/158.1, 760, 763, 765; 326/16, 27, 41; 714/724, 734; 331/46–49, 57
See application file for complete search history.

(56) References Cited

U.S. PATENT DOCUMENTS 4,163,957 A * 8/1979 Knauer et al. ............... 333/165
4,242,654 A * 12/1980 Knauer ....................... 333/165

FOREIGN PATENT DOCUMENTS

JP 5-297077 11/1993

* cited by examiner

*Primary Examiner*—Bryan Bui
(74) *Attorney, Agent, or Firm*—Fish & Richardson P.C.

(57) ABSTRACT

The present invention provides a method for evaluating an intended element or a parameter. In addition, the invention provides an evaluation method for obtaining a more precise result rapidly. According to the invention, a plurality of evaluation circuits are formed over the same substrate, and while simultaneously operating the plurality of evaluation circuits, an output of one evaluation circuit selected by a selection circuit that is formed over the substrate is arbitrarily evaluated.

30 Claims, 8 Drawing Sheets

METHOD FOR EVALUATING SEMICONDUCTOR DEVICE

BACKGROUND OF THE INVENTION

1. Field of the Invention

The present invention relates to a method for evaluating a semiconductor device, in particular, relates to a method for evaluating a semiconductor device using a TEG (test element group, also refer to as test structure).

2. Description of the Related Art

Large scale integrated circuits typified by CPUs have been installed not only in computers but also in various kinds of electric appliances. In recent years, the large scale integrated circuits have been installed in cards and the like as well as the electronic appliances. Products including the large scale integrated circuits have been spread rapidly because of their convenience. Thus, it is thought that applications of the large scale integrated circuits will be continued to be expand.

Meanwhile, an integrated circuit can be obtained by arranging and connecting an enormous number of semiconductor elements such that a certain function can be obtained. However, when failures are caused, e.g., the integrated circuit does not work, since the integrated circuit includes too many semiconductor elements, it is very difficult to identify a cause of failures.

Therefore, in order to analyze the cause of failures of the integrated circuit, a TEG (test element group) is fabricated in each element to evaluate the respective elements (e.g., refer to patent document 1). [Patent Document 1]: Japanese Patent Application Laid-Open No. Hei 5-297077

However, it is difficult to statistically determine parameters by using one TEG Also, there are many parameters that adversely affect an integrated circuit. Therefore, in order to find out parameters that can operate an integrated circuit stably in designing the integrated circuit, enormous numbers of TEGs must be manufactured by way of trial and evaluated, thereby involving a lot of time and effort to produce.

Moreover, it is very difficult to separate an influence of variation caused by the difference of lots for manufacturing TEGs from an influence due to change of intended parameters.

SUMMARY OF THE INVENTION

It is an object of the present invention to provide a method for evaluating an intended element or parameter easily. In particular, it is an object of the invention to provide an evaluation method capable of obtaining a more precise result rapidly.

In an aspect of the present invention, there is provided an evaluation method, wherein a plurality of evaluation circuits are formed over the same substrate, the plurality of evaluation circuits are simultaneously operated, and an output of one evaluation circuit selected by a selection circuit that is formed over the substrate is evaluated arbitrarily.

In another aspect of the invention, there is provided an evaluation method, wherein a plurality of evaluation circuits are formed over the same substrate, the plurality of evaluation circuits are divided into given plural groups to be operated for each group, and an output of one evaluation circuit selected by a selection circuit that is formed over the substrate is evaluated arbitrarily.

In another aspect of the invention, there is provided an evaluation method, wherein at least one kind of signal is commonly input simultaneously in a plurality of evaluation circuits formed over the same substrate, and while operating the plurality of evaluation circuits, one evaluation circuit is selected so that an output of the evaluation circuit is measured. Alternatively, there is provided an evaluation method, wherein while operating the plurality of evaluation circuits, one evaluation circuit is selected, an output of the evaluation circuit is measured, and the data of the evaluation circuit is stored in a recording medium so as to be evaluated chronologically.

In another aspect of the invention, there is provided an evaluation method, wherein at least one kind of signal is commonly input simultaneously in a plurality of evaluation circuits having the same circuit configuration that are formed over the same substrate, and while activating the plurality of evaluation circuits, one evaluation circuit is selected so that an output of the evaluation circuit is measured. Alternatively, there is provided an evaluation method, wherein while operating the plurality of evaluation circuits, one evaluation circuit is selected, an output of the evaluation circuit is measured, and the data of the evaluation circuit is stored in a recording medium so as to be evaluated chronologically.

In another aspect of the invention, there is provided an evaluation method, wherein at least one kind of signal is commonly input simultaneously in a plurality of evaluation circuits including different circuit configurations that are formed over the same substrate, and while operating the plurality of evaluation circuits, one evaluation circuits is selected so that an output of the evaluation circuit is measured. Alternatively, there is provided an evaluation method, wherein while operating the plurality of evaluation circuits, one evaluation circuit is selected, an output of the evaluation circuit is measured, and the data of the evaluation circuit is stored in a recording medium so as to be evaluated chronologically.

In another aspect of the invention, there is provided an evaluation method, wherein at least one kind of signal is commonly input simultaneously in a plurality of evaluation circuits formed over a substrate in which parameters of the plurality of evaluation circuits are changed stepwise, and while operating the plurality of evaluation circuits, one evaluation circuit is selected and an output of the evaluation circuit is measured. Alternatively, there is provided an evaluation method, wherein while operating the plurality of evaluation circuits, one evaluation circuit is selected, an output of the evaluation circuit is measured, and the data of the evaluation circuit is stored in a recording medium so as to be evaluated chronologically.

In another aspect of the invention, there is provided a semiconductor device which has a substrate, a first evaluation circuit over the substrate, a second evaluation circuit over the substrate, a selection circuit connected to the first evaluation circuit and the second evaluation circuit, and a determination circuit connected to the selection circuit, wherein the first evaluation circuit and the second evaluation circuit are connected in parallel.

By providing a plurality of circuits and a selection circuit over the same substrate, measurement can be carried out efficiently. In addition, by providing the plurality of circuits and the selection circuit over the same substrate, evaluation can be performed precisely.

DETAILED DESCRIPTION OF THE INVENTION

The embodiment modes according to the present invention will hereinafter be described referring to the accompanying drawings. Further, the present invention can be carried out in many different modes. It is easily understood by those who skilled in the art that embodiment modes and details herein disclosed can be modified in various ways without departing from the purpose and the scope of the invention. The present invention should not be interpreted as being limited to the description of the embodiment modes to be given below.

[Embodiment Mode 1]

Figure 1A:
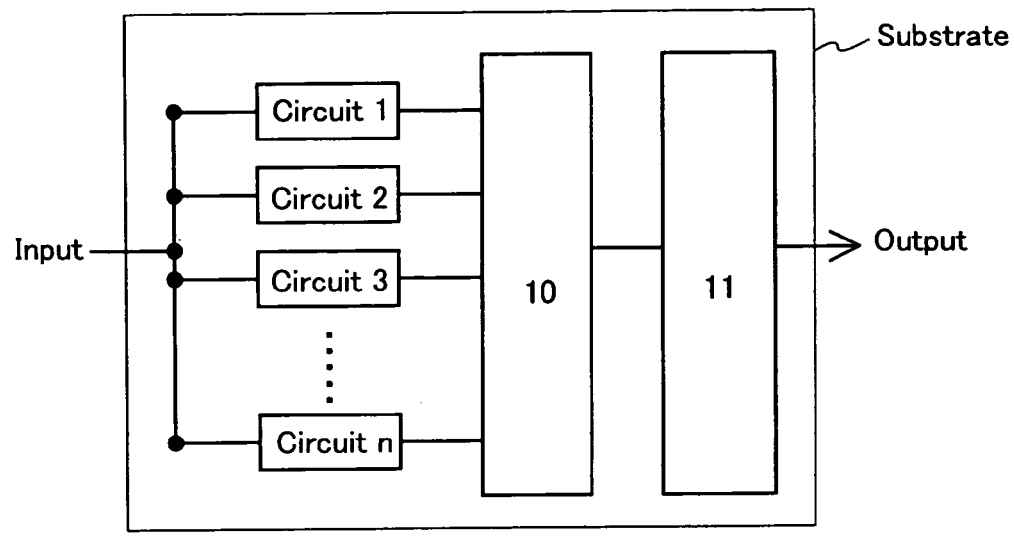
FIGS. 1A to 1C are conceptual diagrams of circuits provided over substrates for evaluation used in the evaluation method according to the present invention.

FIG. 1A shows a substrate for evaluation comprising a plurality of evaluation circuits, a selection circuit 10 and a determination circuit 11. Data output from n pieces of evaluation circuits is input in the same selection circuit 10. Data output from the selection circuit 10 is input in the determination circuit 11. The evaluation circuits 1 to n may comprise either the same circuit configuration or different configurations from one another. When the evaluation circuits comprise the same circuit configuration, circuit parameters such as resistance, capacitance and inductance may be differed in the respective circuits. When using evaluation circuits having the same circuit configuration, operations of the plurality of evaluation circuits can simultaneously be evaluated. On the other hand, when using evaluation circuits having different circuit parameters, a plurality of test parameters can simultaneously be evaluated.

The substrate for evaluation as shown in FIG. 1A has a configuration with one input and one output. By using this configuration for evaluation, the evaluation circuits 1 to n are simultaneously operated, a predetermined evaluation circuit is selected from the evaluation circuits by the selection circuit 10 so that data of the selected evaluation circuit can be output in the determination circuit 11. The data output from the selected evaluation circuit is subjected to an arithmetic processing in the determination circuit 11. A result of the arithmetic processing can be used as data that is necessary to determine an operational state of the selected evaluation circuit. By outputting data of the determination circuit 11 to a computer, the data can be displayed on a screen to be checked by sight. Also, the data can be output into a printer to be printed out. In addition, by storing the data output from the determination circuit 11 in a recording medium, an operating characteristic of the evaluation circuit can be evaluated chronologically. For example, an operational lifetime of the evaluation circuit can be estimated according to the change in time of the output data.

The plurality of evaluation circuits are selected by the selection circuit, and only data of the selected evaluation circuit is output. Any selection method may be employed to select one evaluation circuit from the plurality of evaluation circuits. That is, the evaluation circuits may be selected sequentially or arbitrarily. Alternatively, the evaluation circuits may be selected by changing the weight for each circuit. Also, the evaluation circuits may be selected by arbitrarily switching the selection circuits by an operator. In order to determine the change in operating characteristics of the evaluation circuits with time, it is preferable that the evaluation circuits 1 to n be selected in the same manner. Additionally, address information may be added to the information output from the evaluation circuits so as to identify data of the respective evaluation circuits 1 to n in every case.

In the substrate for evaluation as shown in FIG. 1A, since only a piece of data is output to an external unit by selecting one evaluation circuit by the selection circuit 10, the number of connection portions of terminals for outputting the data to the external unit can be drastically reduced as compared with the case of providing no selection circuit, thereby reducing a connection failure and saving an effort in connecting terminals.

Of course, when the design of the configurations of the selection circuit and the determination circuit are arbitrarily changed in the substrate for evaluation of FIG. 1A, a substrate for evaluation with one input and plural outputs can be formed. Similarly, a substrate for evaluation with plural inputs and one output or plural inputs and plural outputs can be formed. In any case, analytical data can be obtained efficiently while simultaneously activating the plurality of evaluation circuits.

Figure 1B:
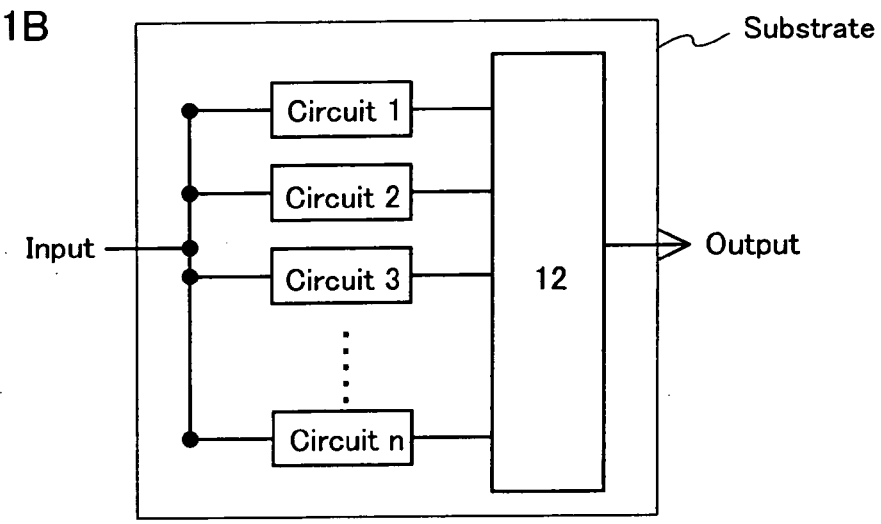

FIG. 1B shows a case in which as substitute for the selection circuit 10 and the determination circuit 11, a selection/determination circuit 12 that operates similarly to the case of using the selection circuit and the determination circuit is used. The configuration other than the selection/determination circuit 12 is the same as that of FIG. 1A. The evaluation circuits as shown in FIG. 1B can be operated similarly to those of FIG. 1A and has the same properties as those of FIG. 1A.

Figure 1C:
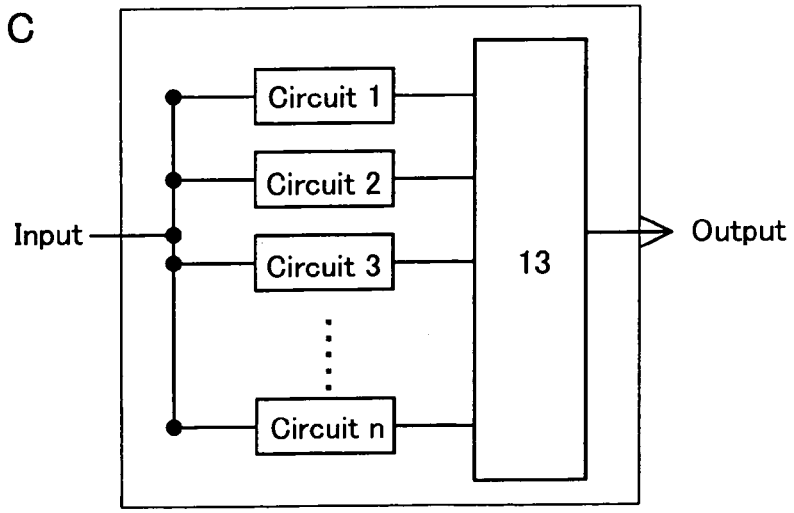

FIG. 1C shows a configuration in which data of a circuit selected by a selection circuit 13 is directly output to an external unit without providing the determination circuit. An output port can be connected to a computer or a printer, a display device, a recording medium and the like via a computer. The configuration other than the selection circuit 13 is similar to that of FIG. 1A. The evaluation circuits as shown in FIG. 1C can be operated similarly to those of FIG. 1A and has the same properties as those of FIG. 1A.

In FIGS. 1A to 1C, various kinds of evaluation circuits can be employed according to a purpose of evaluation. Basic circuit elements of a logic circuit such as an AND circuit, an NOR circuit and an NAND circuit can be evaluated. Further, various types of circuits such as a register, an oscillator and a counter can also be evaluated. A combination of plural functional circuits such as a circuit in which an inverter chain is connected between clock synchronizing registers may be used as an evaluation circuit. In addition, a dynamic memory cell, a static memory cell, a flash memory and the like can be evaluated.

Further, various types of evaluation circuits can be formed over a substrate for evaluation by using a TFT manufactured over a glass or quartz substrate, a TFT that is formed over a glass substrate in advance and then transferred over a plastic substrate, a MOS transistor manufactured over a crystalline silicon substrate or the like, a MOS transistor formed over an SOI substrate, and the like.

The evaluation method using the substrate for evaluation according to the present embodiment mode can be utilized in manufacturing various kinds of devices using semiconductor integrated circuits such as a CPU, a memory, an ID tag used for an RFID (radio frequency identification), a liquid crystal display panel and an EL display panel. More specifically, operating characteristics and operational life times of various kinds of devices can be efficiently evaluated by using substrates for evaluation that are manufactured in the same steps of manufacturing the respective devices. Note that various types of evaluation circuits may be formed over a substrate to be mounted on the various kinds of devices instead of the substrate for evaluation. In this case, the evaluation circuits may be separated from the substrate before completion of the device or may be left in the device.

The plurality of evaluation circuits are formed over each of the substrates for evaluation of the present embodiment mode as shown in FIGS. 1A to 1C. The selection circuits for selecting data output from the plurality of evaluation circuits and performing one output are also provided over the respective substrates for evaluation. Therefore, each substrate for evaluation requires less number of terminals for supplying power to the substrate for evaluation and inputting/outputting a signal. Since the small number of terminals for connecting to an external device is required, the probability of causing operation failures due to the contact failures can be reduced. In addition, a plurality of evaluation circuits can be formed over the same substrate such that evaluation items are segmented.

As set forth above, the plurality of circuits can simultaneously be operated according to this embodiment mode such that many circuits may be measured or evaluated at extremely shorter times as compared with the case of measuring multiple independent circuit TEGs respectively. Accordingly, variation of the circuits and statistical data may be extracted precisely. Since only information for one circuit is output at a time, respective circuits can be identified according to a period during output of a data and analysis may be performed easily. In addition, these circuits are formed over the same substrate, and hence, an adverse influence of the variation caused in respective steps of manufacturing the circuits may be prevented. Moreover, the properties of elements to be compared may be obtained more precisely.

With respect to the plurality of evaluation circuits formed over the substrate for evaluation, all of them may be identical to one another. Alternatively, they may be similar to one another, except that only intended parameters are changed stepwise. The evaluation circuits can arbitrarily be selected depending on an intended test carried out by an operator. By changing intended parameters stepwise with respect to the plurality of evaluation circuits, an operating margin, an optimum solution and the like of an actual circuit can be analyzed easily.

Meanwhile, when a plurality of evaluation circuits are formed to have different configurations from one another, it is possible to select which a circuit will be suitable for a certain purpose. In this case, since tests may be carried out under the same conditions, results that reflect the properties of the circuit can be obtained.

Further, the present embodiment mode can be implemented by being combined with an applicable concept of another embodiment modes of the invention.

[Embodiment Mode 2]

An influence of different output load (i.e., stress to be applied is differed due to difference of a delay situation of a waveform) will be examined in the present embodiment mode by forming a substrate for evaluation of the invention and by using n pieces of similar ring oscillators in which capacitance of the respective ring oscillators is changed stepwise. An analog output is employed. This embodiment mode will be described with reference to FIG. 2.

One purpose of this embodiment mode is that deteriorated properties of the various ring oscillators are evaluated. The deteriorated properties of the ring oscillators with different output load or the different number of stages (number of inverters) of each logic gate are evaluated respectively and compared with a deteriorated property of a more complicated logic circuit, and hence, the deteriorated property of the more complicated logic circuit can be evaluated easily.

A substrate for evaluation according to the embodiment mode comprises n pieces of ring oscillators in which the capacitance is varied stepwise; switches 100 for turning outputs of respective ring oscillators on/off; and a shift register. By stopping a supply of a clock to the shift register, the switches are controlled to be turned on/off so as to select one ring oscillator, thereby obtaining an output of the ring oscillator. The shift register sequentially select the n pieces of ring oscillators to obtain outputs corresponding to respective ring oscillators. In this embodiment mode, the shift register and the switches 100 correspond to the selection circuit of Embodiment Mode 1 and the determination circuit of Embodiment Mode 1 is not mounted on the same substrate. Further, the determination circuit may be provided either over the substrate or outside of the substrate. Alternatively, the determination circuit may not be provided both over and outside of the substrate.

Figure 2:
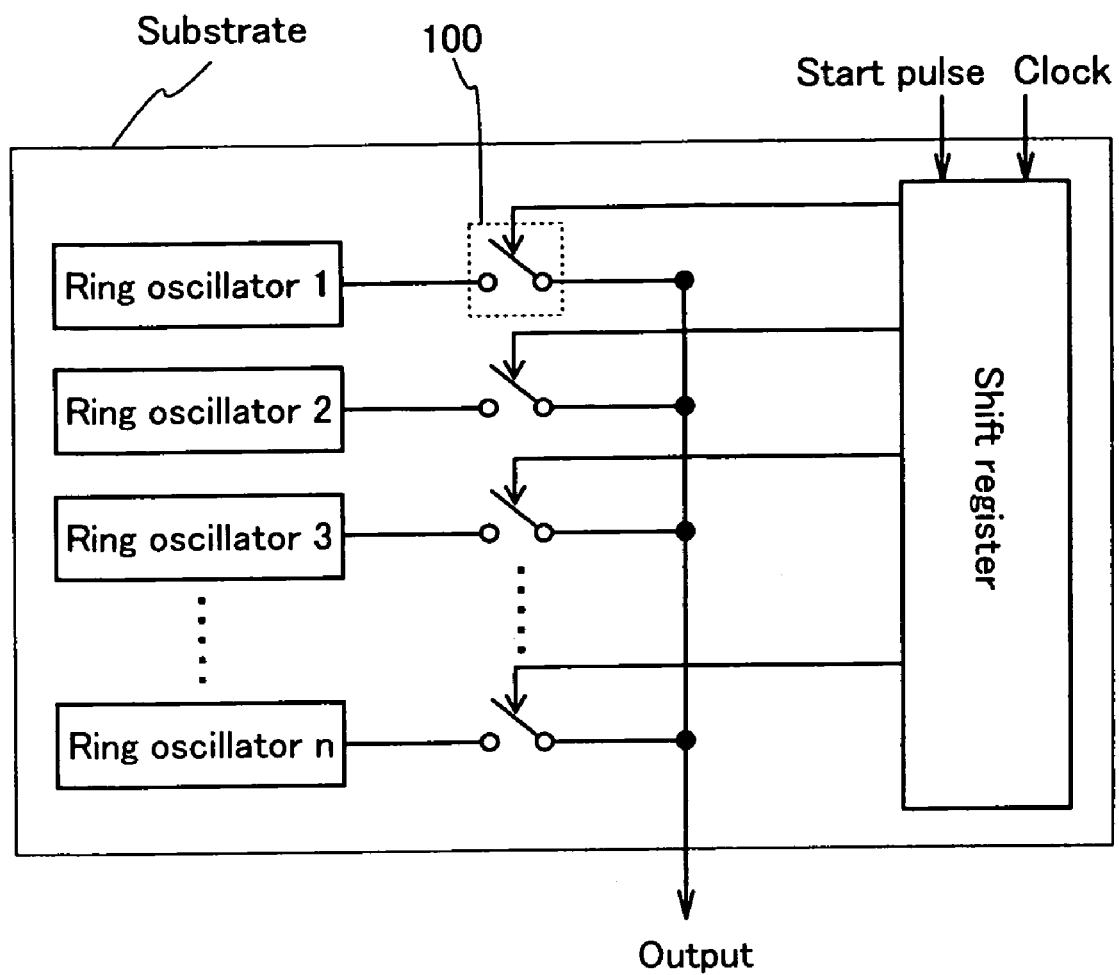
FIG. 2 is a diagram of a circuit provided over a substrate for evaluation that are used in the evaluation method according to the invention.

Since the configuration of FIG. 2 employs the analog output, an analog signal is directly output to an oscilloscope and a plotter so that a waveform can be observed. According to the waveform, a lot of information about an oscillation frequency, an amplitude, a rise time, a fall time and the like can be obtained. When evaluating the degree of deterioration, the all ring oscillators are measured by a unit of $\Delta T$ that is sufficiently shorter with respect to a deterioration rate. Measurement of two or more units may be carried out to find a coefficient of fluctuation of these numerical values. The output data may be processed properly. For example, the output data may be digitized or a necessary part of the output data may be extracted to be determined. Alternatively, the output data may be stored in a memorizing means so that it is evaluated by reading out it from the memorizing means on an as needed basis. The output data may be stored in the memorizing means via a computer.

As a result of this measurement, deteriorated properties of the various ring oscillators can be evaluated. When the output load of each logic gate and the deteriorated properties of the ring oscillators with different number of stages (number of inverters) are respectively evaluated and compared with a deteriorated property of the more complicated logic circuit, the deteriorated property of the more complicated logic circuit can be evaluated easily by using the ring oscillators.

When evaluation is performed by using such a substrate for evaluation of the present invention, since the plurality of circuits are simultaneously operated, the circuits can be measured or evaluated at shorter times as compared with the case of measuring multiple independent circuit TEGs individually, and therefore, the variation or the statistical data can be extracted precisely. In addition, by employing one output, individual circuits can be identified according to timing when a data is output and the analysis can be performed easily. Further, since these circuits are formed over the same substrate, an adverse influence of the variation caused in respective steps of manufacturing the circuits can be suppressed and an influence of an element to be compared can be obtained precisely.

By changing the capacitance of the circuits stepwise to change the output load, an operating margin, an optimum solution and the like can be analyzed easily. Further, a decoder can be used as the selection circuit, instead of the shift register.

Figure 3:
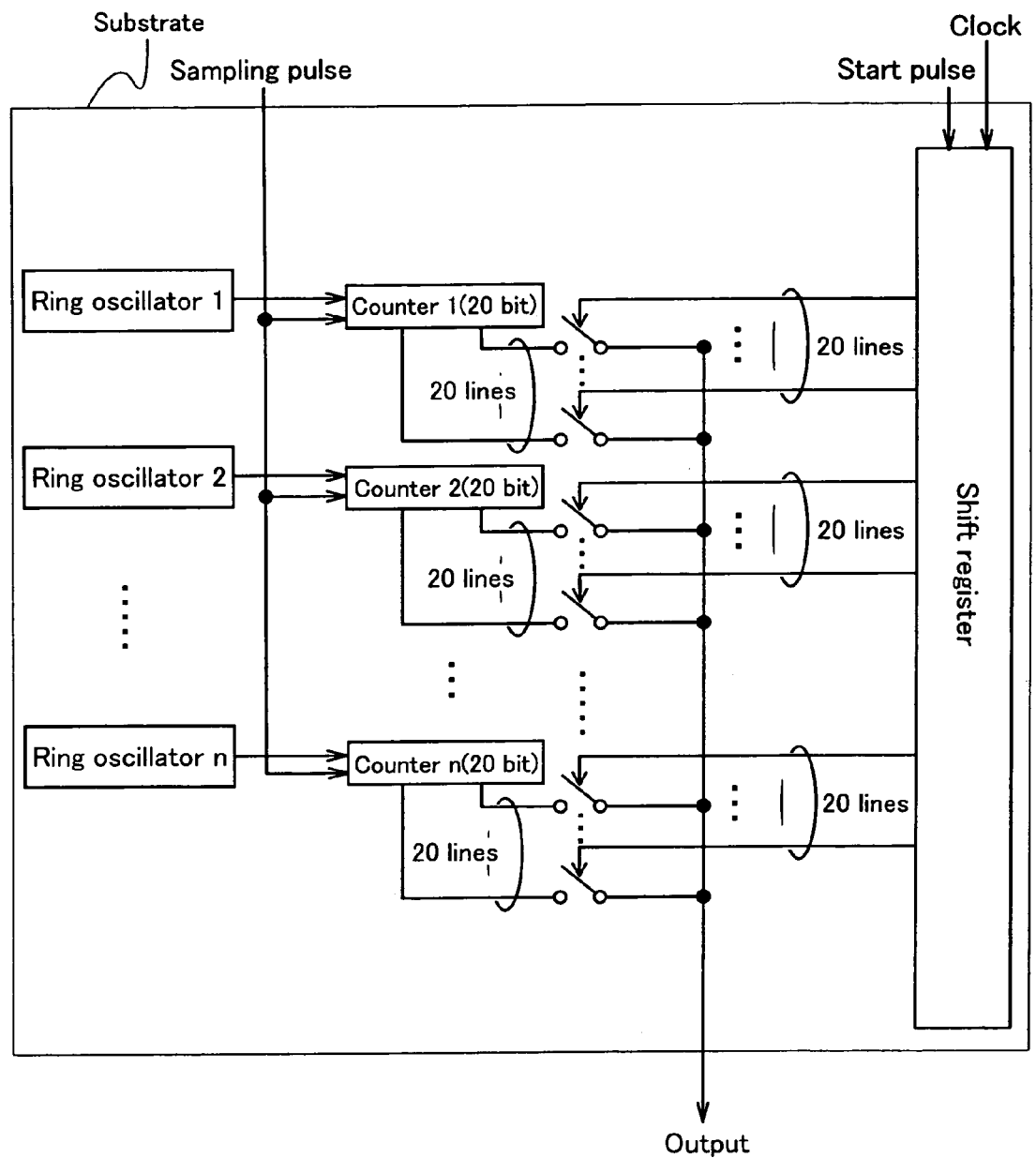
FIG. 3 is a diagram of a circuit provided over a substrate for evaluation that is used in the evaluation method according to the invention.

When a digital output is employed in this embodiment mode, for example, the substrate for evaluation is formed to have a configuration as shown in FIG. 3. In this embodiment mode, the ring oscillators are evaluated by using 20-bit counters.

In the case of the digital output, the ring oscillator, which will output data, is selected by using the output of each stage of the shift register. Also, a sampling pulse is input in the counter. When the sampling pulse is low, the counter is reset. When the sampling pulse is high, the counter counts the sampling pulse. A sampling time is determined according to a width of the sampling pulse. Since the digital output is employed, the digital output is read in by a logic analyzer and an electronic file is analyzed so that information about an oscillation frequency and the like can be obtained. In the case of evaluating the deterioration, a coefficient of fluctuation of these numerical values may be used.

Alternatively, an oscillation frequency and the like may be automatically calculated in measurement and only a numerical value may be stored ultimately. An operator can obtain predetermined information by reading out and processing the stored data on an as needed basis. Also, a series of treatments after the calculation of each parameter may be performed by a computer.

Figure 4:
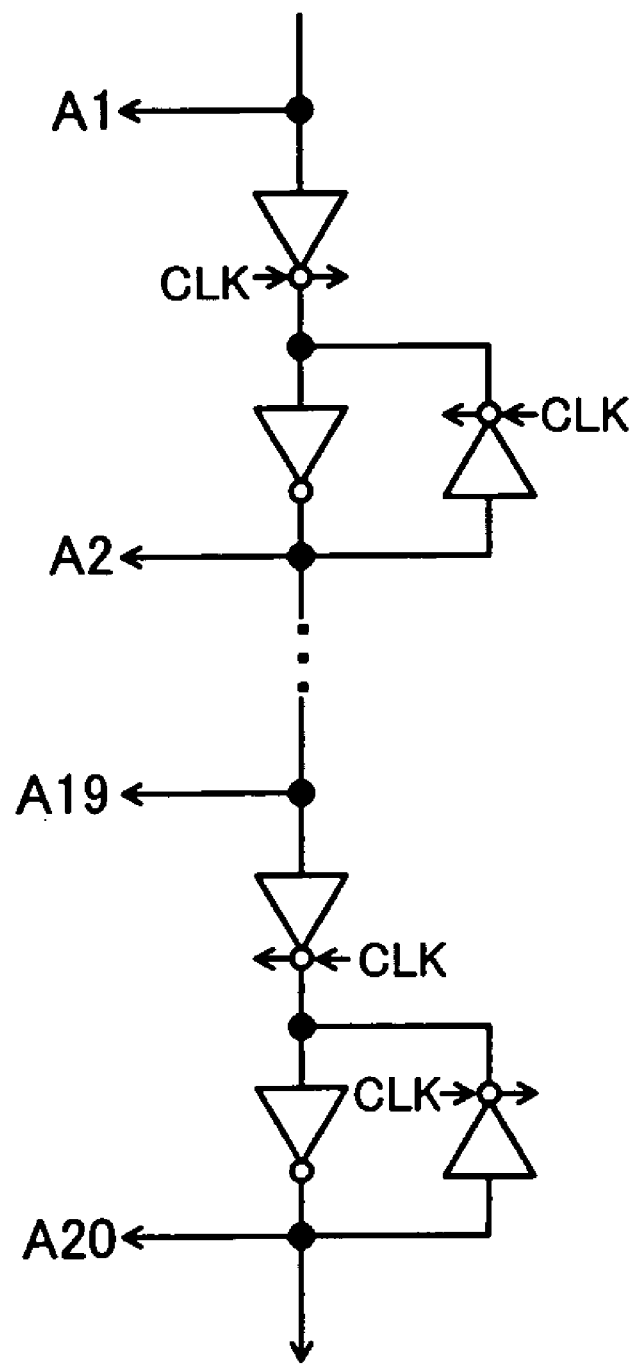
FIG. 4 is a circuit diagram of a shift register that can be used in the invention.

Further, a shift register with a configuration as shown in FIG. 4 may be used as the shift register that is used in outputting a digital signal. Moreover, a decoder may be used as substitute for the shift register.

Moreover, in this case, the counters can be considered as an example of the determination circuit. That is, the number of pulses output by the ring oscillators is counted during a sampling time. For example, if the number of pulses is $2^k$ or more, the $k^{th}$ bit becomes "1". Therefore, the $k^{th}$ bit can be considered as data that is determined if the number of pulses is $2^k$ or more.

Further, the present embodiment mode can be implemented by being combined with an applicable concept of another embodiment modes according to the invention.

[Embodiment Mode 3]

The present embodiment mode shows a configuration in which n pieces of the same ring oscillators are provided as a plurality of circuits over a substrate for evaluation according to the invention so as to examine an influence due to variation in semiconductor elements included in the ring oscillators. An analog output is employed. This embodiment mode will be described with reference to FIG. 2.

The variation in reliability of the semiconductor elements such as thin film transistors that are included in the ring oscillators is assumed as one of reasons why a result of the deterioration caused in one ring oscillator is differed of a result of the deterioration caused in a CPU. In order to examine the influence of the variation in reliability of the semiconductor elements, the substrate for evaluation according to the invention is formed.

The substrate for evaluation according to the invention comprises n pieces of ring oscillators each of which has the same configuration, switches 100 for turning outputs of the respective ring oscillators on/off, and a shift register. By stopping a supply of a clock into the shift register, the switches are controlled to turn on/off to select one ring oscillator, thereby obtaining its output. In this embodiment mode, the shift register and the switches 100 correspond to the selection circuit of Embodiment Mode 1. The determination circuit of Embodiment Mode 1 is not mounted over the same substrate in this embodiment mode.

In this case, since the configuration of FIG. 2 employs the analog output, an analog signal is directly output to an oscilloscope and a plotter so that a waveform can be observed. According to the waveform, a lot of information about an oscillation frequency, an amplitude, a rise time, a fall time and the like can be obtained. When evaluating the deterioration, the all ring oscillators are measured by a unit of ΔT that is sufficiently shorter with respect to a deterioration rate. Measurement of two or more units may be carried out to find a coefficient of fluctuation of these numerical values. The output data may be processed properly. For example, the output data may be digitized or a necessary part of the output data may be extracted to be determined. Alternatively, the output data may be stored in a memorizing means so that it is evaluated by reading out it from the memorizing means on an as needed basis. The output data may be stored in the memorizing means via a computer.

As a result of this measurement, the degree of deterioration of a most deteriorated ring oscillator is closest to the degree of deterioration due to the semiconductor elements in the CPU.

When performing the evaluation by using the substrate for evaluation of the invention, since the plurality of circuits can simultaneously be operated and one output is employed, the plurality of circuits can be evaluated at extremely shorter times as compared with the case of measuring multiple independent circuit TEGs individually so that statistical data can be extracted precisely. In addition, since these circuits are formed over the same substrate, an adverse influence of the variation caused in each step of manufacturing the circuits can be prevented. Therefore, the influence of different degrees of deterioration of the semiconductor elements can be confirmed more precisely.

When outputting a digital signal in this embodiment mode, the substrate for evaluation is formed to have a configuration as shown in FIG. 3. This embodiment mode shows an example in which ring oscillators are evaluated by using 20-bit counters. In the case of outputting the digital signal, the ring oscillator, which will output data, is selected by using an output of each stage of the shift register. Also, a sampling pulse is input in the counter. When the sampling pulse is low, the counter is reset. When the sampling pulse is high, the counter counts the sampling pulse. A sampling time is determined according to a width of the sampling pulse. Since a digital output is employed, the digital output is read in by a logic analyzer and an electronic file is analyzed so that information about an oscillation frequency and the like can be obtained. In the case of evaluating the degree of deterioration of the circuits, a coefficient of fluctuation of these numerical values may be used.

Moreover, in this case, the counters can be considered as an example of the determination circuit. That is, the number of pulses output by the ring oscillators is counted during a sampling time. For example, if the number of pulses is $2^k$ or more, the $k^{th}$ bit becomes "1". Therefore, the $k^{th}$ bit can be considered as data that is determined if the number of pulses is $2^k$ or more.

Alternatively, an oscillation frequency and the like in the measurement may be automatically calculated and only a numerical value may be stored ultimately. An operator can obtain predetermined information by reading out and processing the stored data on an as needed basis. Also, a series of treatments after the calculation of each parameter may be performed by a computer.

Further, the shift register with the configuration as shown in FIG. 4 may be used in outputting a digital signal. As the selection circuit, a decoder may be used, in addition to the shift register.

Furthermore, the present embodiment mode can be implemented by being freely combined with an acceptable concept of another embodiment modes of the invention.

[Embodiment Mode 4]

Figure 5A:
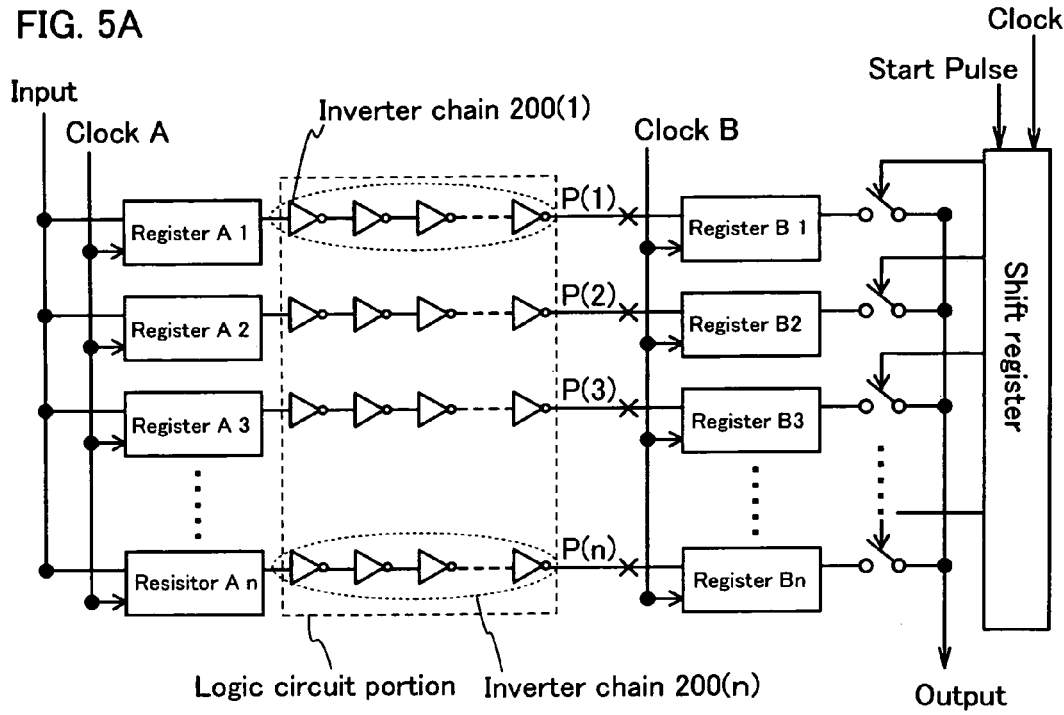
FIGS. 5A and 5B are diagrams of circuits provided over substrates for evaluation that are used in the evaluation method according to the invention.
Figure 5B:
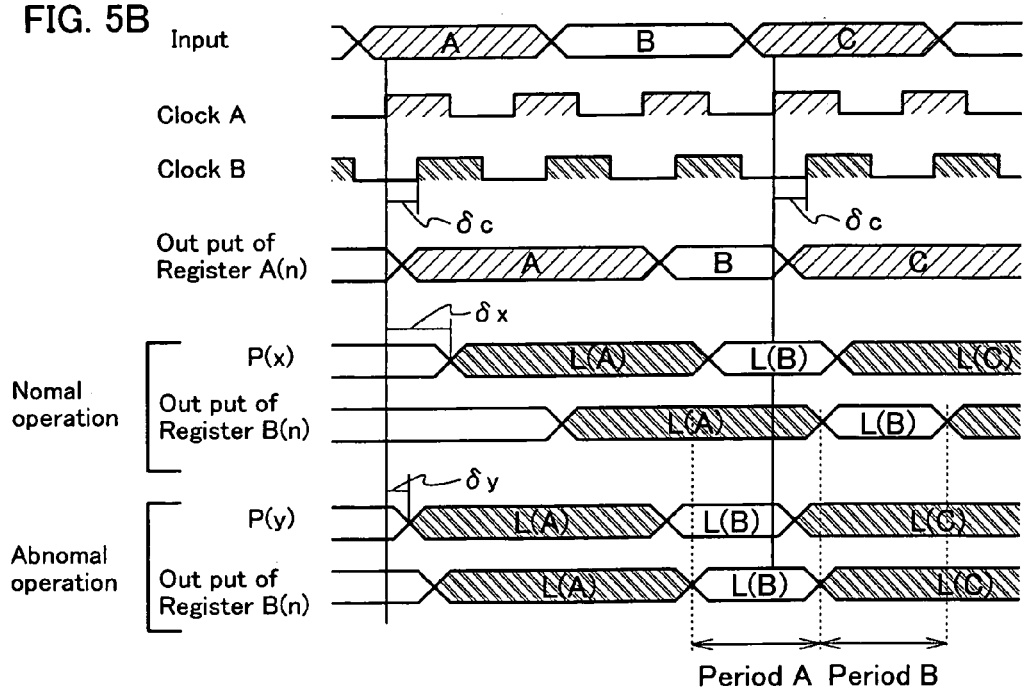

The present embodiment mode will describe a method for evaluating an operating margin of a circuit modeled as a complicated logic circuit such as a CPU, a substrate for evaluation and an evaluation system used for this method with reference to FIGS. 5A and 5B.

A substrate for evaluation of the present embodiment mode includes n pieces of registers A1 to An synchronizing with a clock A; n pieces of registers B1 to Bn synchronizing with a clock B; and inverter chains 200*i* ("i" corresponds 1 to n) connected between the registers Ai and the registers Bi. One evaluation circuit comprises a register Ai, an inverter chain 200*i* and a register Bi. Over the substrate for evaluation, n pieces of evaluation circuits are formed. Input data from an external unit is input in the registers A1 to An. Also, data of the registers B1 to Bn is output to an external unit via the switches. A shift register controls to turn the switches on/off by stopping a clock so that one evaluation circuit is selected to obtain an output thereof. Further, the n pieces of evaluation circuits are formed over the same substrate to form the substrate for evaluation of the invention.

Meanwhile, it can be thought that a logic circuit is generally connected with various types of logic gates having a various kinds of loads between registers synchronizing with clocks. Such logic circuits are briefly modeled as evaluation circuits in FIG. 5A. The operating margin of this evaluation circuit can be thought as an operating margin of data transfer between the registers. However, the operating margin depends on delay $\delta g$ due to the logic gate between the registers, clock skew (delay $\delta c$ between a clock A and a clock B) and the like.

For example, when an inverter chain of this evaluation circuit is adjusted to a critical path (a logic circuit under a condition in which an operating margin is most strict), the logic circuit can be modeled and the operating margin with respect to the clock skew can be evaluated. In addition, by using the plurality of evaluation circuits, evaluation can be carried out in consideration of the variation of the circuits. An evaluation method using this embodiment mode will be described below.

In order to evaluate an operating margin of clock skew in consideration of the variation of properties of thin film transistors included in the logic circuits, n pieces of evaluation circuits are first formed to have the same configuration. The evaluation circuits are adjusted to a critical path of the logic circuits. Then, a clock B that is delayed by $\delta c1$ with respect to a clock A to be input in the register An is input in a register Bn and outputs of the n pieces of evaluation circuits are respectively measured.

When $\delta c1$ is within the allowable range of the clock skew in the all evaluation circuits, the evaluation circuits output normally. The output results may be output into an external logic analyzer, oscilloscope or monitor. Alternatively, the output results may be printed out.

Also, the output results may be stored in a memorizing means so that the output results may be read out to be evaluated on an as needed basis. The output results may be stored in the memorizing means via a computer.

Subsequently, the clock B that is delayed by $\delta c2$ different from the $\delta c1$ is input in the register Bn to be measured similarly. Hereinafter, outputs of the n pieces of evaluation circuits are respectively measured in the same manner. When the $\delta c2$ is within the allowable range of delay in the evaluation circuits, the all evaluation circuits output normally. When the $\delta c2$ is beyond the allowable range of delay in the evaluation circuits, the evaluation circuits output abnormally. Although the amount of $\delta c$ is increased in this embodiment mode, it is not particularly limited.

Accordingly, it is possible to easily estimate how much the allowable range of the clock skew is changed depending on the variation of the properties of the thin film transistors included in the logic circuits, at short times. This allows to easily obtain information for adjusting a clock skew of thin film transistors of a CPU, which are formed in the same manufacturing process as those of the logic circuits, to a suitable level at short times.

Additionally, a variety of operating margins can be evaluated by using the inverter chains with various types of numbers or loads as inverter chains corresponding to the critical path of the logic circuits.

Consequently, a margin in consideration of the properties of the thin film transistors and their variations can be obtained rapidly and precisely by knowing the limits of $\delta c$ so that it is possible to feed back the margin to a design of the CPU. In addition, the design of the CPU can be changed rapidly to improve the yield of the CPU and operating characteristics thereof.

The cases of a normal operation and an abnormal operation of the circuits as shown in FIG. 5A will be described with reference to FIG. 5B. Concretely, $\delta x$ represents delay in a point P(x) where data output from a register Ax is input in the logic circuit (e.g., the inverter chain 200*x* in FIG. 5A) and output from the logic circuit. $\delta y$ represents delay in a point P(y) where data output from a register Ay is input in the logic circuit and output therefrom. Also, L(A) is a calculation result concerned to an input A. L(B) is a calculation result related to an input B. L(C) is a calculation result related to an input C. Further, the timing chart of FIG. 5B shows an example in the case of using registers that are inverted on the leading edge of a clock. When the logic circuit is normally operated, the L(A) is output in a period A whereas the L(B) is output in a period B.

Data is output from the register An in synchronization with the clock A. Until the data output from the register An is input in a logic circuit portion and output from the logic circuit portion, delay of $\delta n$ is caused in the point P(n) immediately before the register Bn depending on the properties of the thin film transistors, wiring resistance or capacitance of the logic circuit portion. The $\delta n$ takes a different value in each of the evaluation circuits 1 to n according to the variation of properties of the thin film transistors in the logic circuit portion or the difference in configuration of the logic circuits. An output from the logic circuit that is delayed by the δn and the clock B that is delayed by δc with respect to the clock A are input in the register Bn.

In the case of an evaluation circuit x in which delay δx of a signal in the logic circuit portion is longer than δc the L(A) is output in the period A while the L(B) is output in the period B, and therefore, the evaluation circuit x is operated normally. However, in the case of an evaluation circuit y in which delay δy of a signal in the logic circuit portion is shorter than δc, the L(B) is output in the period A and the L(C) is output in the period B. Therefore, the evaluation circuit y is operated abnormally.

When the evaluation circuits 1 to n with the same configuration are employed, the evaluation circuits are measured by changing the delay δc of the clock B with respect to the clock A step-by-step. This allows to rapidly and precisely grasp an allowable range of delay of the clock B such that the evaluation circuits are not operated abnormally due to delay in the logic circuit portion that is caused by the variation of properties of the thin film transistors included in the evaluation circuits.

Furthermore, by changing the configurations of the logic circuit portion of the evaluation circuits 1 to n respectively, an allowable range of delay δc of the clock B with respect to the clock A in the evaluation circuits having the respective logic circuit portion can be grasped rapidly and precisely.

Figure 6:
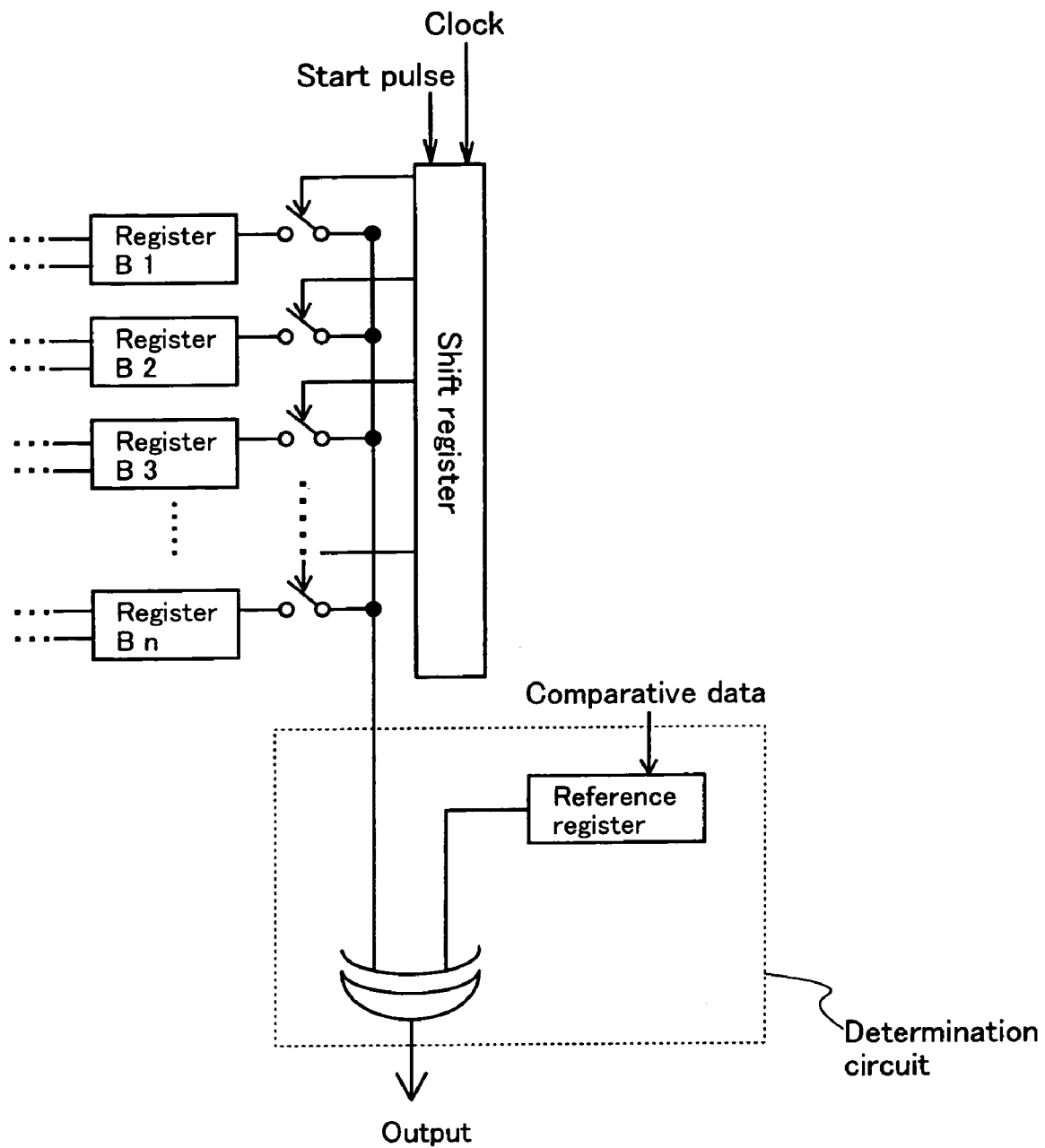
FIG. 6 shows an example of a determination circuit provided over a substrate for evaluation that is used in the evaluation method of the invention.

Further, a determination circuit as shown in FIG. 6 may be provided in the circuit of FIG. 5. In FIG. 6, comparative data is input in a reference register of the determination circuit. L(A) is output in a period A while L(B) is output in a period B. As a result, when the determination circuit of FIG. 6 outputs 0, it is determined that the evaluation circuits are operated normally, and when the determination circuit outputs 1, it is determined that the evaluation circuits are operated abnormally.

By feeding back the thus-obtained results to a design of a logic circuit such as a CPU, the logic circuit can be designed more precisely. As a consequence, a circuit with a highly reliable operation can be provided.

Since a large scale circuit such as a CPU comprises a larger number of elements as compared with a ring oscillator, variation of the elements becomes a significant parameter. The substrate for evaluation according to the present invention has a purpose of evaluating the variation in deterioration degrees of the elements by using a number of ring oscillators. By evaluating the distribution of deterioration degrees for a number of ring oscillators and converting the evaluated results into the number of elements used in the large scale circuit such as the CPU, the degree of deterioration of the CPU can be evaluated.

Moreover, the present embodiment mode can be implemented by being freely combined with an acceptable concept of another embodiment modes of the invention.

[Embodiment Mode 5]

The present embodiment mode will describe the evaluation method of the invention with reference to flow charts.

Figure 7:
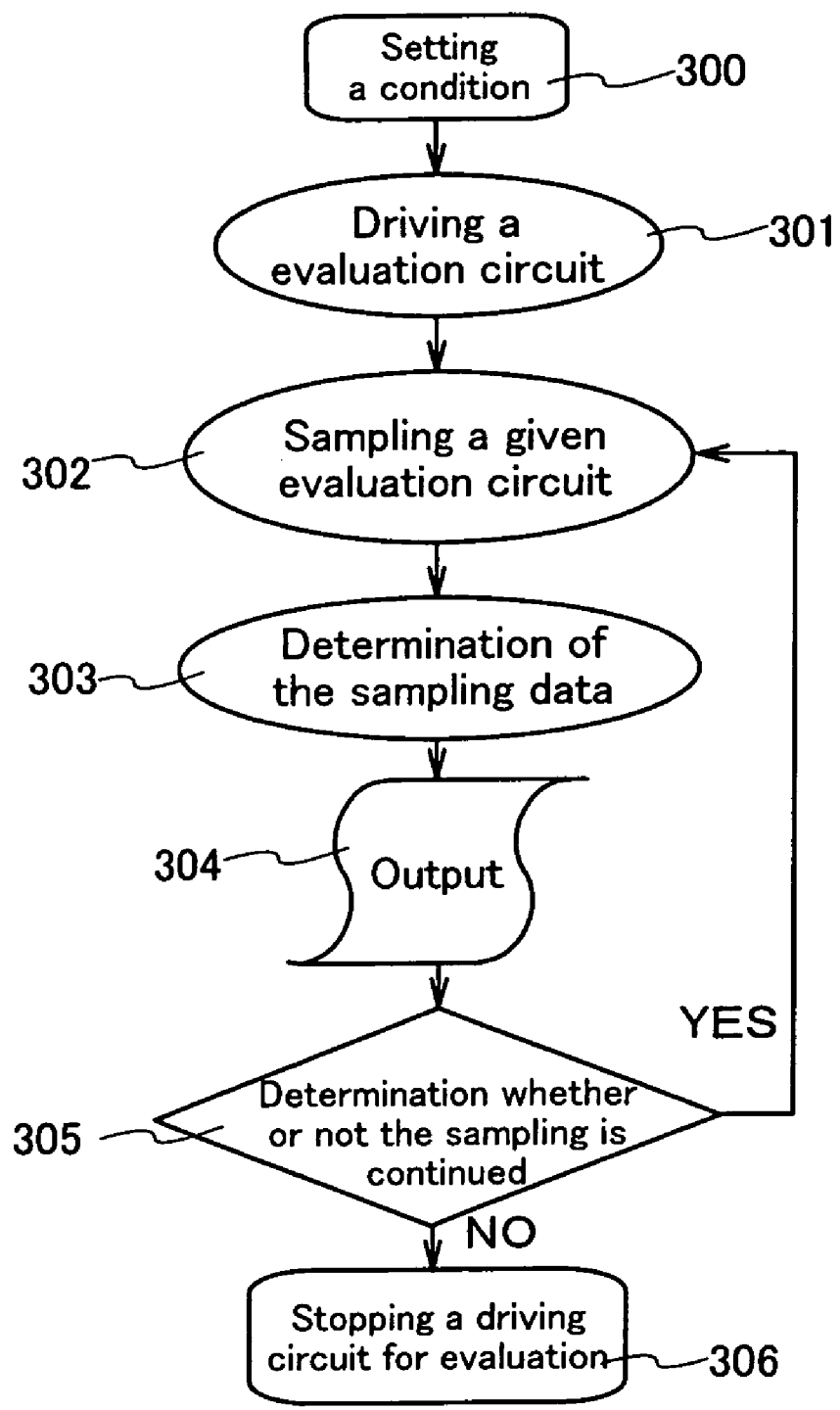
FIG. 7 shows an example of a flow chart corresponding to the evaluation method according to the invention.

FIG. 7 is a flow chart in the case of using the substrate for evaluation as shown in FIG. 1A. Upon setting a condition for driving n pieces of evaluation circuits (300), the evaluation circuits are driven (301). Subsequently, a given evaluation circuit is sampled (302) and sampling data is determined (303), thereby outputting a result (304). Thereafter, it is determined whether or not the sampling is continuously carried out to evaluate the evaluation circuit (305). A criterion for determining whether the evaluation is continued or stopped is set by an operator in advance. As examples of the determination criteria, a time, a sampling time, a determination result, a value of sampling data and the like can be mentioned. Of course, the evaluation may be stopped manually. When the evaluation is continued, the flow returns to the sampling step (302) and a series of treatments are repeated. In the step 305, upon determining the stop of the evaluation, the drive of the evaluation circuits is stopped (306), and hence, the evaluation is completed.

Figure 8:
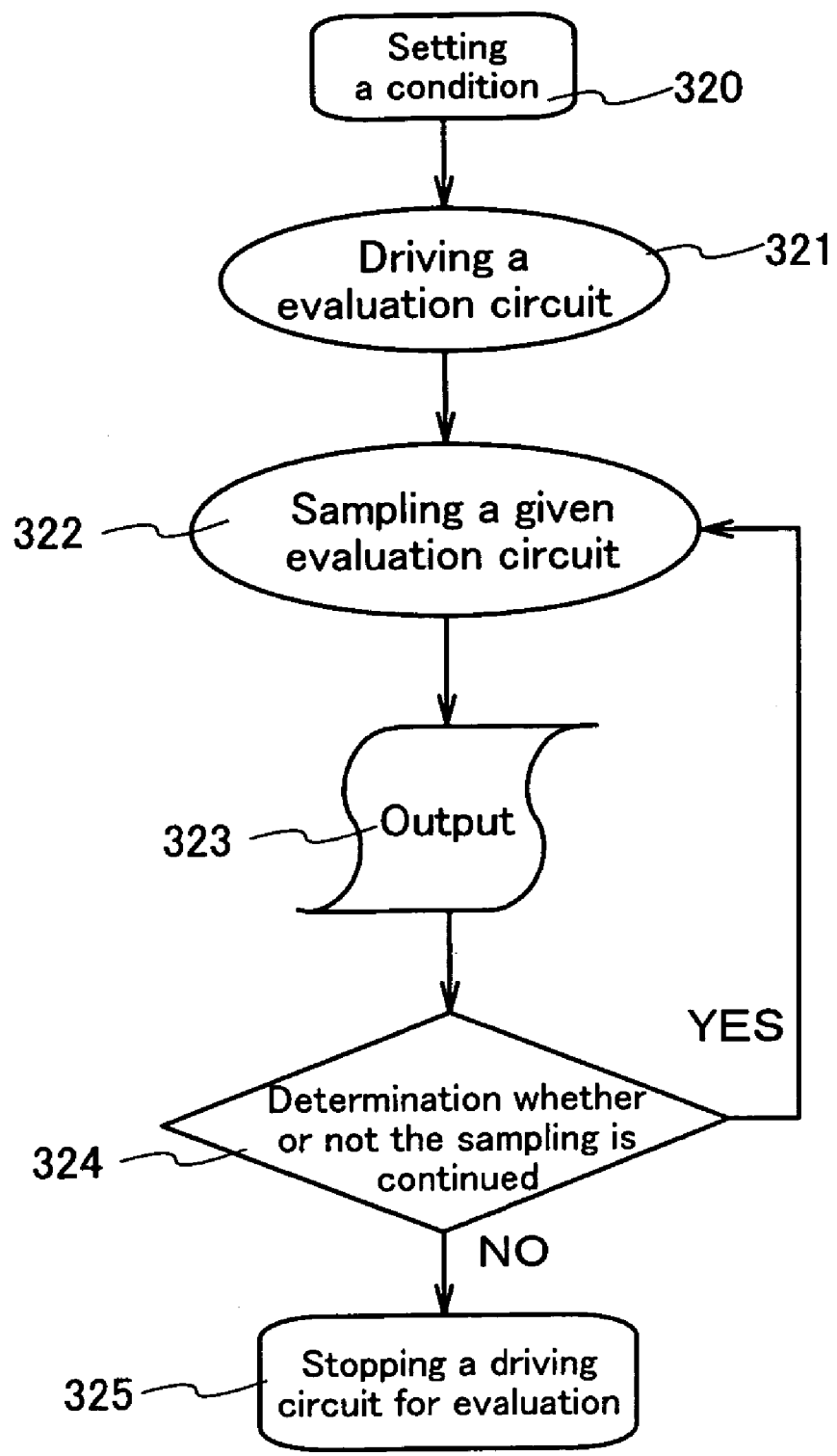
FIG. 8 shows an example of a flow chart corresponding to the evaluation method according to the invention.

FIG. 8 is a flow chart in the case of evaluating evaluation circuits in a different way than FIG. 7. This flow chart of FIG. 8 uses the substrate for evaluation as shown in FIG. 1C. Upon setting a condition for driving n pieces of evaluation circuits (320), the n pieces of evaluation circuits are driven (321) and a given evaluation circuit is sampled in the same manner as the flow chart as shown in FIG. 7. After sampling the given evaluation circuit, the sampling data is output without determining the sampling data (323). Thereafter, it is determined whether the evaluation is continued or stopped (324) in the same manner as FIG. 7. When it is determined that the evaluation should be continued, the flow is returned to the sampling step (322) and a series of processes are repeated. When it is determined that the evaluation should be stopped, the drive of the evaluation circuits is stopped (325), and hence, the evaluation is completed.

The present application is based on Japanese Priority Application No. 2004-151093 filed on May 20, 2004 with the Japanese Patent Office, the entire contents of which are hereby incorporated by reference.

What is claimed is:

1. A method for extracting circuit parameters from a semiconductor device, comprising:
   inputting a signal commonly to each of a plurality of evaluation circuits formed over a substrate;
   consecutively selecting individual evaluation circuits from the plurality of evaluation circuits with a selection circuit; and
   measuring output data for individual evaluation circuits, while operating the evaluation circuits concurrently, by measuring outputs of the individual evaluation circuits as each evaluation circuit is consecutively selected; and
   using the measured output data in determining circuit parameters of the semiconductor device.

2. A method for extracting circuit parameters from a semiconductor device according to claim 1,
   wherein at least one of the plurality of evaluation circuits is a ring oscillator.

3. A method for extracting circuit parameters from a semiconductor device according to claim 1,
   wherein at least one of the evaluation circuits is a register.

4. A method for extracting circuit parameters from a semiconductor device, comprising:
   inputting a signal commonly to each of a plurality of evaluation circuits formed over a substrate;
   consecutively selecting individual evaluation circuits from the plurality of evaluation circuits with a selection circuit;
   processing outputs from individual evaluation circuits, with a determination circuit, as each evaluation circuit is consecutively selected;
   and
   using the processed outputs in determining circuit parameters of the semiconductor device.

5. A method for extracting circuit parameters from a semiconductor device according to claim 4,
   wherein each of the plurality of evaluation circuits is a ring oscillator.

6. A method for extracting circuit parameters from a semiconductor device according to claim 4,
wherein each of the plurality of evaluation circuits is a register.

7. A method for extracting circuit parameters from a semiconductor device, comprising:
inputting a signal commonly to each of a plurality of evaluation circuits formed over a substrate;
consecutively selecting individual evaluation circuits from the plurality of evaluation circuits with a selection circuit;
measuring output data for individual evaluation circuits, while operating the plurality of evaluation circuits concurrently, by measuring outputs of the individual evaluation circuits as each evaluation circuit is consecutively selected; and
using the measured output data in determining circuit parameters of the semiconductor device, wherein the evaluation circuits are designed such that the evaluation circuits have different circuit parameters.

8. A method for extracting circuit parameters from a semiconductor device according to claim 7,
wherein at least one of the plurality of evaluation circuits is a ring oscillator.

9. A method for extracting circuit parameters from a semiconductor device according to claim 7,
wherein at least one of the plurality of evaluation circuits is a register.

10. A method for extracting circuit parameters from a semiconductor device, comprising:
inputting a signal commonly to each of a plurality of evaluation circuits formed over a substrate;
consecutively selecting individual evaluation circuits from the plurality of evaluation circuits with a selection circuit;
processing outputs from individual evaluation circuits, with a determination circuit, as each evaluation circuit is consecutively selected;
measuring an output from the determination circuit while operating the evaluation circuits concurrently; and
using the measured output from the determination circuit in determining circuit parameters of the semiconductor device, wherein the evaluation circuits are designed such that the evaluation circuits have different circuit parameters.

11. A method for extracting circuit parameters from a semiconductor device according to claim 10,
wherein at least one of the plurality of evaluation circuits is a ring oscillator.

12. A method for extracting circuit parameters from a semiconductor device according to claim 10,
wherein at least one of the plurality of evaluation circuits is a register.

13. A method for extracting circuit parameters from a semiconductor device, comprising:
inputting a signal commonly to each of a plurality of evaluation circuits formed over a substrate;
consecutively selecting individual evaluation circuits from the plurality of evaluation circuits with a selection circuit;
measuring output data for individual evaluation circuits, while operating the plurality of evaluation circuits concurrently, by measuring outputs of the individual evaluation circuits as each evaluation circuit is consecutively selected;
storing the measured output data for the individual evaluation circuits in a recording medium; and
evaluating a change over time in the output data stored for the individual evaluation circuits.

14. A method for extracting circuit parameters from a semiconductor device according to claim 13,
wherein at least one of the plurality of evaluation circuits is a ring oscillator.

15. A method for extracting circuit parameters from a semiconductor device according to claim 13,
wherein at least one of the plurality of evaluation circuits is a register.

16. A method for extracting circuit parameters from a semiconductor device, comprising:
inputting a signal commonly to a plurality of evaluation circuits formed over a substrate;
consecutively selecting individual evaluation circuits from the plurality of evaluation circuits with a selection circuit;
processing outputs from individual evaluation circuits, with a determination circuit, as each evaluation circuit is selected;
measuring an output from the determination circuit while operating the evaluation circuits concurrently;
storing the measured output in a recording medium; and
evaluating a change over time in the stored output data.

17. A method for extracting circuit parameters from a semiconductor device according to claim 16,
wherein each of the plurality of evaluation circuits is a ring oscillator.

18. A method for extracting circuit parameters from a semiconductor device according to claim 16,
wherein at least one of the plurality of evaluation circuits is a register.

19. A method for extracting circuit parameters from a semiconductor device, comprising:
inputting a signal commonly to each of a plurality of evaluation circuits formed over a substrate; and
consecutively selecting individual evaluation circuits from the plurality of evaluation circuits with a selection circuit;
measuring output data for individual evaluation circuits, while operating the plurality of evaluation circuits concurrently, by measuring outputs of the individual evaluation circuits as each evaluation circuit is consecutively selected;
storing the measured output data for the individual evaluation circuits in a recording medium; and
evaluating a change over time in the output data stored for the individual evaluation circuits, wherein the plurality of evaluation circuits are designed such that the evaluation circuits have different circuit parameters.

20. A method for extracting circuit parameters from a semiconductor device according to claim 19,
wherein at least one of the plurality of evaluation circuits is a ring oscillator.

21. A method for extracting parameters from a semiconductor device according to claim 19,
wherein at least one of the evaluation circuits is a register.

22. A method for extracting circuit parameters from a semiconductor device, comprising:
inputting a signal commonly to each of a plurality of evaluation circuits formed over a substrate; and
consecutively selecting individual evaluation circuits from the plurality of evaluation circuits with a selection circuit;
processing outputs from individual evaluation circuits, with a determination circuit, as each evaluation circuit is selected;

measuring an output from the determination circuit while operating the evaluation circuits concurrently;

storing the measured output in a recording medium; and evaluating a change over time in the stored output data, wherein the evaluation circuits are designed such that the evaluation circuits have different circuit parameters.

23. A method for extracting circuit parameters from a semiconductor device according to claim 22, wherein at least one of the evaluation circuits is a ring oscillator.

24. A method for extracting parameters from a semiconductor device according to claim 22, wherein at least one of the evaluation circuits is a register.

25. A semiconductor device comprising:

a substrate;

a first evaluation circuit over the substrate;

a second evaluation circuit over the substrate;

a first switch;

a second switch;

a selection circuit for consecutively selecting the first evaluation circuit and the second evaluation circuit; and a determination circuit for calculating output data from the first evaluation circuit and the second evaluation circuit, wherein the determination circuit is electrically connected to the selection circuit;

wherein the first evaluation circuit is electrically connected to the selection circuit through the first switch, wherein the second evaluation circuit is electrically connected to the selection circuit through the second switch, and wherein the selection circuit is configured to control opening and closing of the first and second switches such that when the first evaluation circuit is selected, the first switch is closed and the second switch is opened, and when the second evaluation circuit is selected, the first switch is opened and the second switch is closed.

26. A semiconductor device according to claim 25, wherein at least one of the first evaluation circuit and the second evaluation circuit is a ring oscillator.

27. A semiconductor device according to claim 25, wherein at least one of the first evaluation circuit and the second evaluation circuit is a register.

28. A semiconductor device comprising:

a substrate;

an input terminal for receiving a signal;

an output terminal connected to a computer;

a first evaluation circuit over the substrate;

a second evaluation circuit over the substrate;

a first switch;

a second switch; and a selection circuit for consecutively selecting the first evaluation circuit and the second evaluation circuit, wherein the first evaluation circuit is electrically connected to the selection circuit through the first switch, wherein the second evaluation circuit is electrically connected to the selection circuit through the second switch, and wherein the selection circuit is configured to control opening and closing of the first and second switches such that when the first evaluation circuit is selected, the first switch is closed and the second switch is opened, and when the second evaluation circuit is selected, the first switch is opened and the second switch is closed.

29. A semiconductor device according to claim 28, wherein at least one of the first evaluation circuit and the second evaluation circuit is a ring oscillator.

30. A semiconductor device according to claim 28, wherein at least one of the first evaluation circuit and the second evaluation circuit is a register.

* * * * *